(12) United States Patent
Chen et al.

(10) Patent No.: US 12,142,554 B2
(45) Date of Patent: Nov. 12, 2024

(54) ELECTRONIC COMPONENT AND MANUFACTURING METHOD THEREOF

(71) Applicant: Innolux Corporation, Miao-Li County (TW)

(72) Inventors: Yeong-E Chen, Miao-Li County (TW); Yi-Hung Lin, Miao-Li County (TW); Cheng-En Cheng, Miao-Li County (TW); Wen-Hsiang Liao, Miao-Li County (TW); Cheng-Chi Wang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 389 days.

(21) Appl. No.: 17/523,895

(22) Filed: Nov. 10, 2021

(65) Prior Publication Data

US 2023/0090376 A1  Mar. 23, 2023

(30) Foreign Application Priority Data

Sep. 17, 2021 (CN) .......................... 202111095423.2

(51) Int. Cl.
*H01L 23/498* (2006.01)
*H01L 21/48* (2006.01)
*H01L 23/00* (2006.01)

(52) U.S. Cl.
CPC .... *H01L 23/49833* (2013.01); *H01L 21/4857* (2013.01); *H01L 23/49822* (2013.01); *H01L 23/49838* (2013.01); *H01L 24/16* (2013.01); *H01L 2224/16227* (2013.01)

(58) Field of Classification Search
CPC ........... H01L 23/49833; H01L 21/4857; H01L 23/49822; H01L 23/49838
See application file for complete search history.

(56) References Cited

U.S. PATENT DOCUMENTS

| 2002/0027282 A1* | 3/2002 | Kawakami | .............. C03C 3/062 257/E23.009 |
| 2006/0113653 A1* | 6/2006 | Xiaoqi | ................... H01L 25/18 257/E25.013 |

FOREIGN PATENT DOCUMENTS

| TW | 200942091 | 10/2009 |
| TW | I655728 | 4/2019 |

OTHER PUBLICATIONS

"Office Action of Taiwan Counterpart Application", issued on Feb. 13, 2023, p. 1-p. 8.

* cited by examiner

*Primary Examiner* — Samuel A Gebremariam
(74) *Attorney, Agent, or Firm* — JCIPRNET

(57) ABSTRACT

An electronic component and a manufacturing method thereof are provided. The electronic component includes a structure member and a connecting member. The structure member includes at least one working unit. The at least one working unit is disposed in a first region. The connecting member is disposed on the structure member and includes a second region. The second region is overlapped with the first region, and a metal density of the second region is less than a metal density of the first region. The electronic component and the manufacturing method thereof of the embodiment of the disclosure include the effect of improving the reliability or quality of the electronic component.

19 Claims, 13 Drawing Sheets

| Connecting member Metal density% | Stress | Structure member Metal density% | | | | | | | | | | |
|---|---|---|---|---|---|---|---|---|---|---|---|---|
| | | 0% | 10% | 20% | 30% | 40% | 50% | 60% | 70% | 80% | 90% | 100% |
| 0% | 5 | -90 | -70 | -50 | -40 | -30 | -25 | -20 | -15 | -10 | -5 | 0 |
| 10% | 10 | -85 | -65 | -45 | -35 | -25 | -20 | -15 | -10 | -5 | 0 | 5 |
| 20% | 15 | -80 | -60 | -40 | -30 | -20 | -15 | -10 | -5 | 0 | 5 | 10 |
| 30% | 20 | -75 | -55 | -35 | -25 | -15 | -10 | -5 | 0 | 5 | 10 | 15 |
| 40% | 30 | -70 | -50 | -30 | -20 | -10 | -5 | 0 | 5 | 10 | 15 | 20 |
| 50% | 40 | -60 | -40 | -20 | -10 | 0 | 5 | 10 | 15 | 20 | 25 | 30 |
| 60% | 55 | -50 | -30 | -10 | 0 | 10 | 15 | 20 | 25 | 30 | 35 | 40 |
| 70% | 70 | -35 | -15 | 5 | 15 | 25 | 30 | 35 | 40 | 45 | 50 | 55 |
| 80% | 85 | -20 | 0 | 20 | 30 | 40 | 45 | 50 | 55 | 60 | 65 | 70 |
| 90% | 105 | -5 | 15 | 35 | 45 | 55 | 60 | 65 | 70 | 75 | 80 | 85 |
| 100% | 125 | 15 | 35 | 55 | 65 | 75 | 80 | 85 | 90 | 95 | 100 | 105 |
| | | 35 | 55 | 75 | 85 | 95 | 100 | 105 | 110 | 115 | 120 | 125 |

FIG. 3

ELECTRONIC COMPONENT AND MANUFACTURING METHOD THEREOF

CROSS-REFERENCE TO RELATED APPLICATION

This application claims the priority benefit of China application serial no. 202111095423.2, filed on Sep. 17, 2021. The entirety of the above-mentioned patent application is hereby incorporated by reference herein and made a part of this specification.

BACKGROUND

Technical Field

The disclosure relates to an electronic component and a manufacturing method thereof, and particularly relates to an electronic component with improved reliability and a manufacturing method thereof.

Description of Related Art

Electronic devices or splicing electronic devices have been widely used in different fields such as communication, display, vehicle, or aircraft. With a booming development of the electronic devices, the electronic devices show a trend towards lightweight and thinness. Therefore, requirements on reliability or quality of electronic devices become higher.

SUMMARY

The disclosure is directed to an electronic component and a manufacturing method thereof, which have an effect of improving reliability or quality of the electronic component, such as mitigating a warpage problem, reducing signal noise, or improving signal quality.

According to an embodiment of the disclosure, the electronic component includes a structure member and a connecting member. The structure member includes at least one working unit. The at least one working unit is disposed in a first region. The connecting member is disposed on the structure member and includes a second region. The second region is overlapped with the first region, and a metal density of the second region is less than a metal density of the first region.

According to an embodiment of the disclosure, the manufacturing method of the electronic component includes following steps. First, a structure member is formed, where the structure member includes at least one working unit, and the at least one working unit is disposed in a first region. Then, a connecting member is formed on the structure member, where the connecting member includes a second region. In a schematic cross-sectional view, the second region is overlapped with the first region, and a metal density of the second region is less than a metal density of the first region.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3 is a diagram showing a relationship between metal density and stress in a structure member/connecting member.

DESCRIPTION OF THE EMBODIMENTS

Figure 1A:
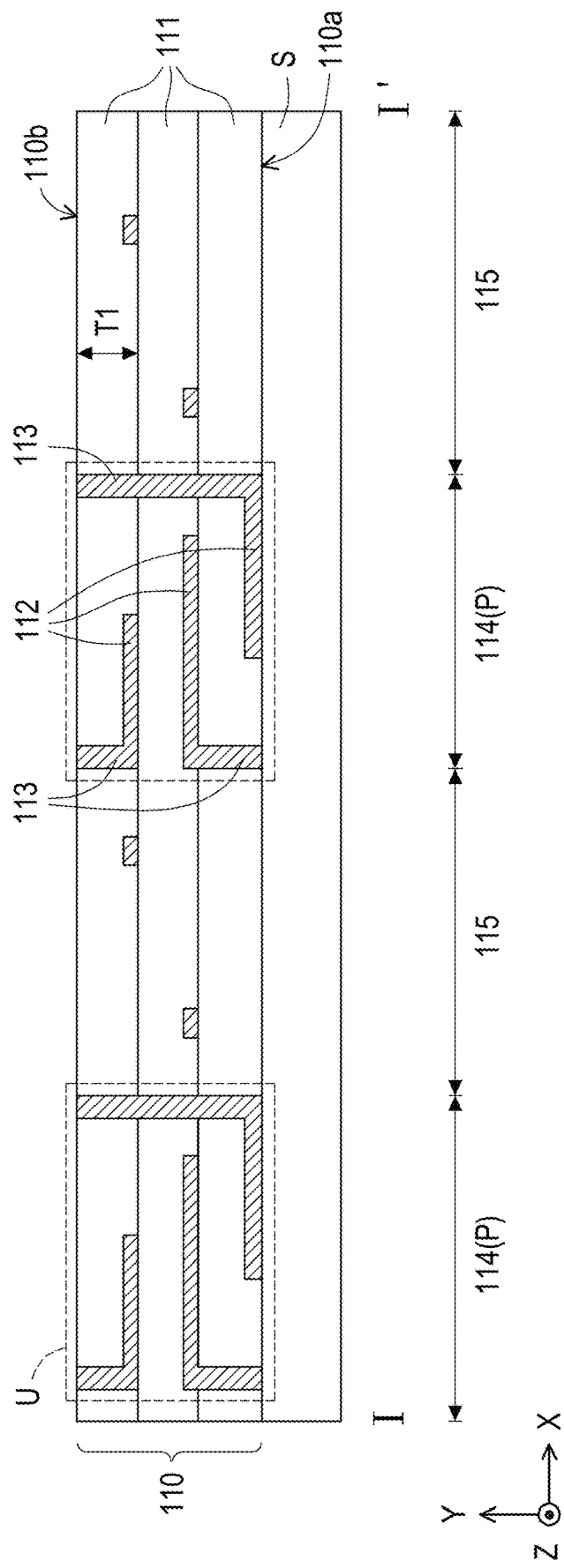
FIG. 1A to FIG. 1C are schematic partial cross-sectional views of a manufacturing method of an electronic component according to an embodiment of the disclosure.

The disclosure may be understood by referring to the following detailed description with reference of the accompanying drawings. It should be noted that, in order to facilitate the reader's understanding and the brevity of the drawings, the multiple drawings in the disclosure only depict a part of an electronic device, and specific components in the drawings are not drawn according to actual scales. In addition, the number and size of each component in the drawings are only for illustration, and are not used to limit the scope of the disclosure.

In the following description and claims, the words "contain" and "include" are open-ended words, so they should be interpreted as meaning "contain but not limited to . . . ".

It should be understood that when an element or film layer is referred to as being "on" or "connected" to another element or film layer, it may be directly on the other element or film layer or directly connected to the other element or film layer, or there is an intermediate element or film layer between the above two elements (indirect connection). Conversely, when an element is referred to be "directly" on or "directly connected" to another element or film layer, there is no intermediate element or film layer between the above two elements.

Although the terms "first", "second", "third" . . . may be used to describe various constituent elements, the constituent elements are not limited to these terms. These terms are only used to distinguish a single constituent element from other constituent elements in the specification. The same terms may not be used in the claims, and may be replaced with first, second, third . . . according to a declared order of the elements in the claims. Therefore, in the following description, the first constituent element may be the second constituent element in the claims.

In the specification, the terms "about", "around", "substantial", and "approximate", generally refers to be within 10%, or within 5%, or within 3%, or within 2%, or within 1%, or within 0.5% of a given value or range. The quantity given here is an approximate quantity, i.e., in the absence of a specific description of "about", "around", "substantial", and "approximate", the meanings of "about", "around", "substantial", and "approximate" may still be implied.

In some embodiments of the disclosure, regarding joining and connecting terms such as "connect", "interconnect", etc., unless specifically defined, it may mean that two structures are in direct contact, or it may also mean that the two structures are not in direct contact, and there are other structures provided between these two structures. The terms about joining and connecting may also include situations where both structures are movable or both structures are fixed. In addition, the term "couple" includes any direct and indirect electrical connection means.

The electronic component may include a display device, a packaging device, an antenna device (such as a liquid crystal antenna), a sensing device, a light-emitting device, a touch device, or a splicing device, but the disclosure is not limited thereto. The electronic component may include a bendable and flexible electronic component. An appearance of the electronic component may be rectangular, circular, polygonal, a shape including a curved edge, or other suitable shapes. The display device may include, for example, light-emitting diode (LED), liquid crystal, fluorescence, phosphor, quantum dot (QD), other suitable materials, or a combination of the above materials, but the disclosure is not limited thereto. The LED may include, for example, organic light-emitting diode (OLED), inorganic light-emitting diode (inorganic LED), mini LED, micro LED, or quantum dot LED (QDLED), other suitable LEDs, or any combination of the above LEDs, but the disclosure is not limited thereto. The display device may also include, for example, a spliced display device, but the disclosure is not limited thereto. The antenna device may be, for example, a liquid crystal antenna, but the disclosure is not limited thereto. The antenna device may include, for example, an antenna splicing device, but the disclosure is not limited thereto. It should be noted that the electronic component may be any permutation and combination of the foregoing, but the disclosure is not limited thereto. In addition, the appearance of the electronic component may be rectangular, circular, polygonal, a shape including a curved edge, or other suitable shapes. The electronic component may include peripheral systems such as a driving system, a control system, a light source system, a shelving system, etc., to support a display device, an antenna device, or a splicing device. Hereinafter, the electronic component is used to describe the content of the disclosure, but the disclosure is not limited thereto.

It should be noted that in the following embodiments, features of several different embodiments may be replaced, reorganized, and mixed to complete other embodiments without departing from the spirit of the disclosure. The features between the embodiments may be mixed and matched arbitrarily as long as they do not violate or conflict with the spirit of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
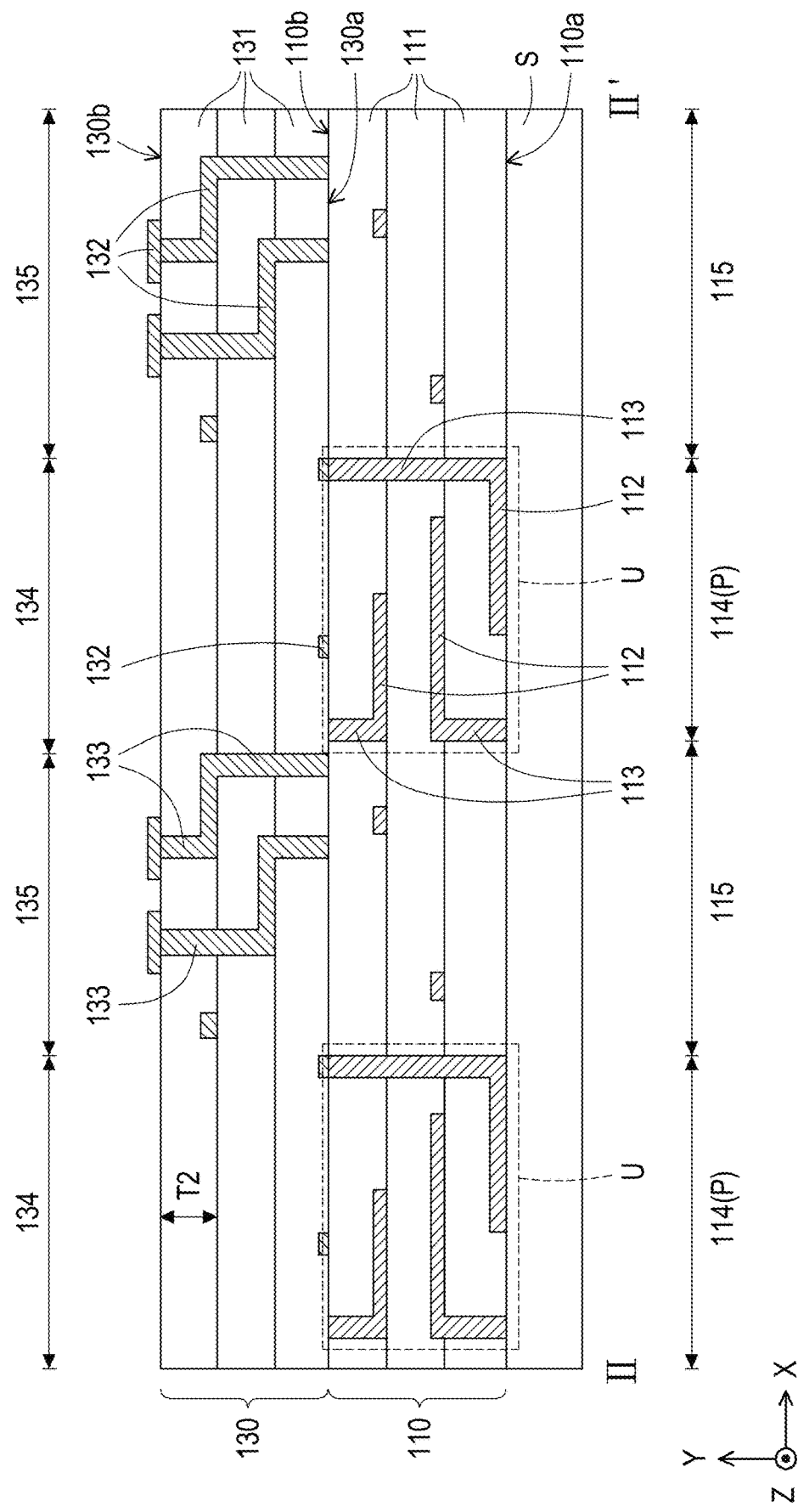
Figure 1C:
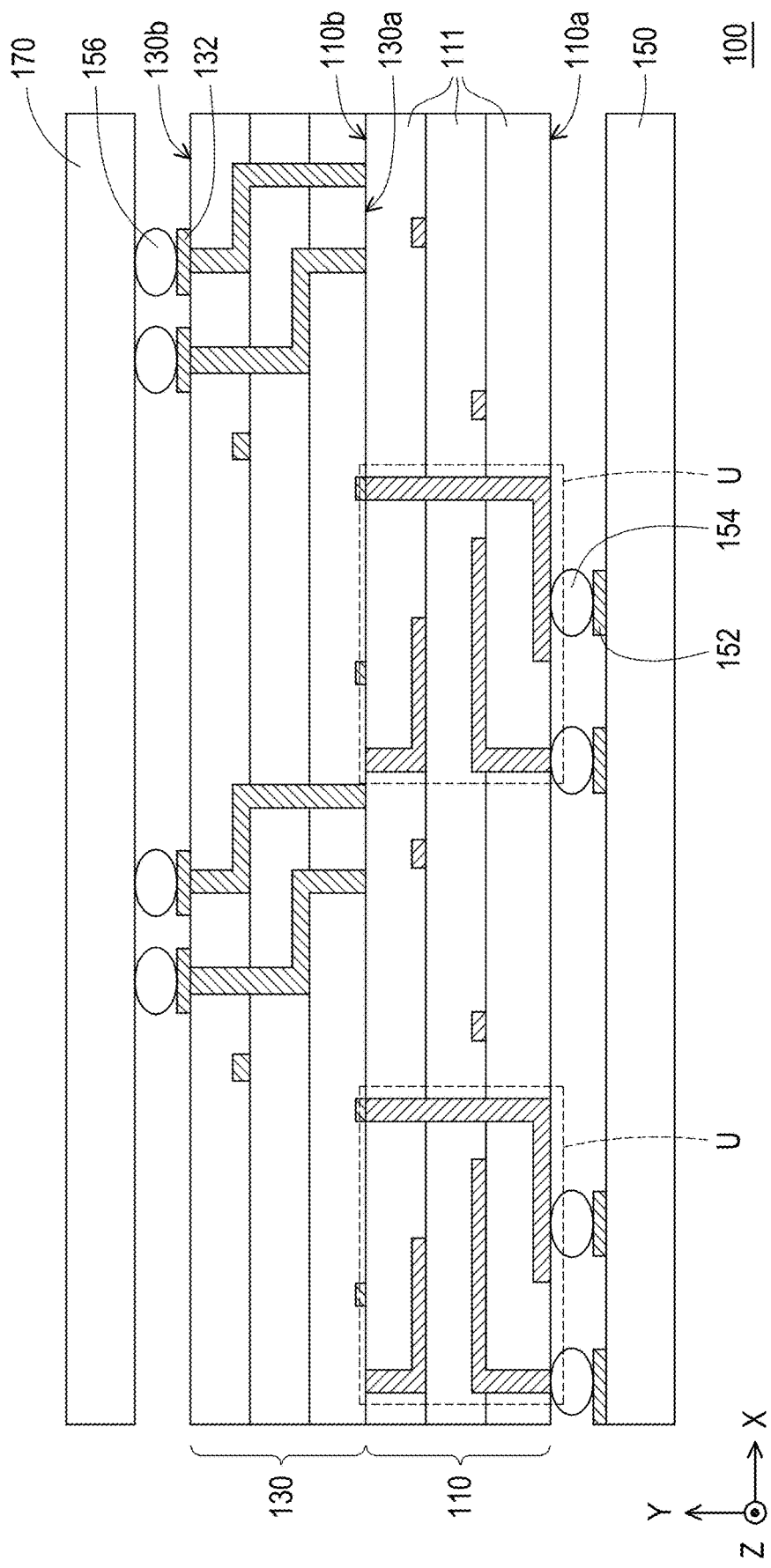
Figure 2A:
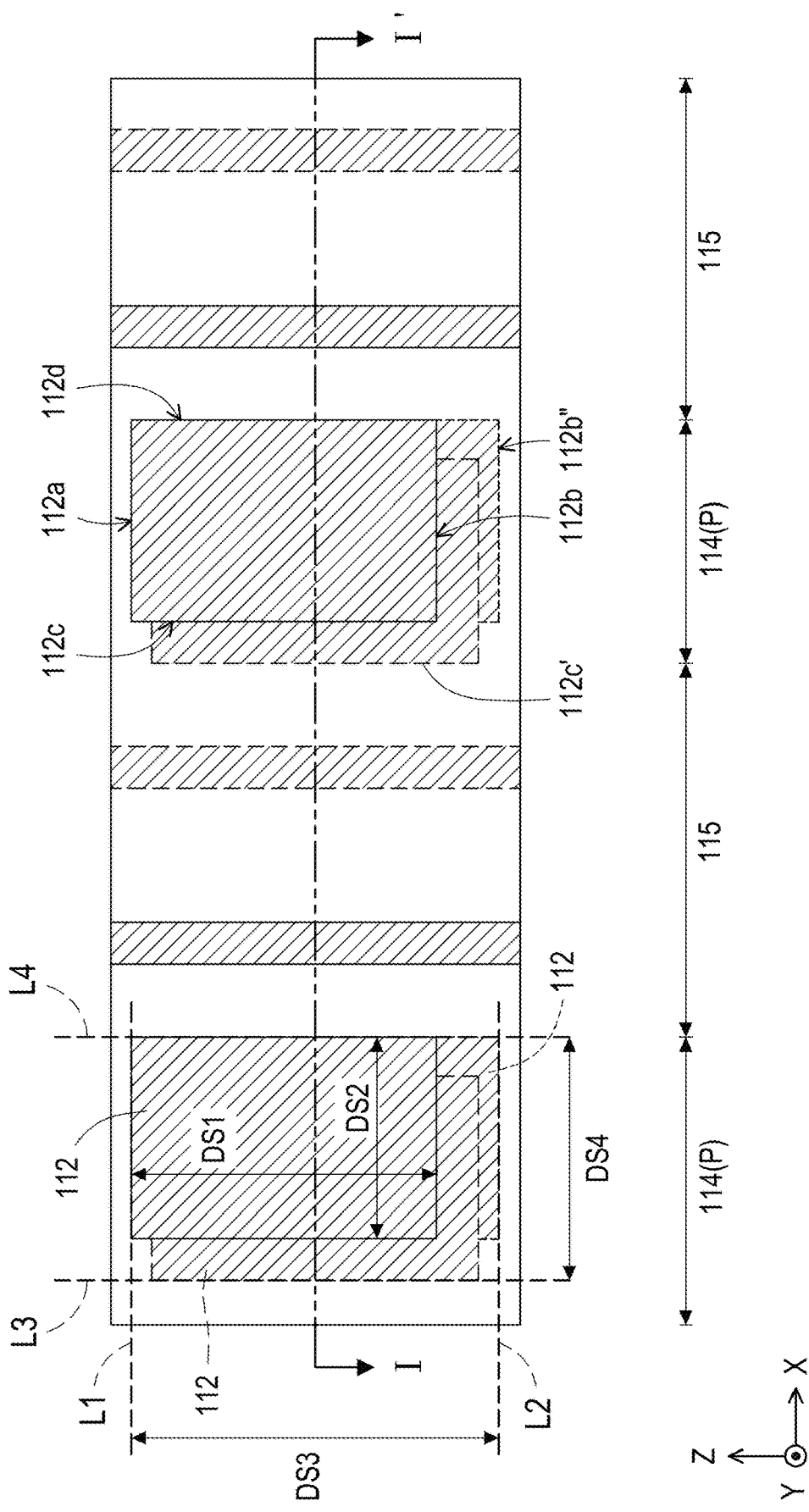
FIG. 2A is a schematic top view of a structure member of FIG. 1A.
Figure 2B:
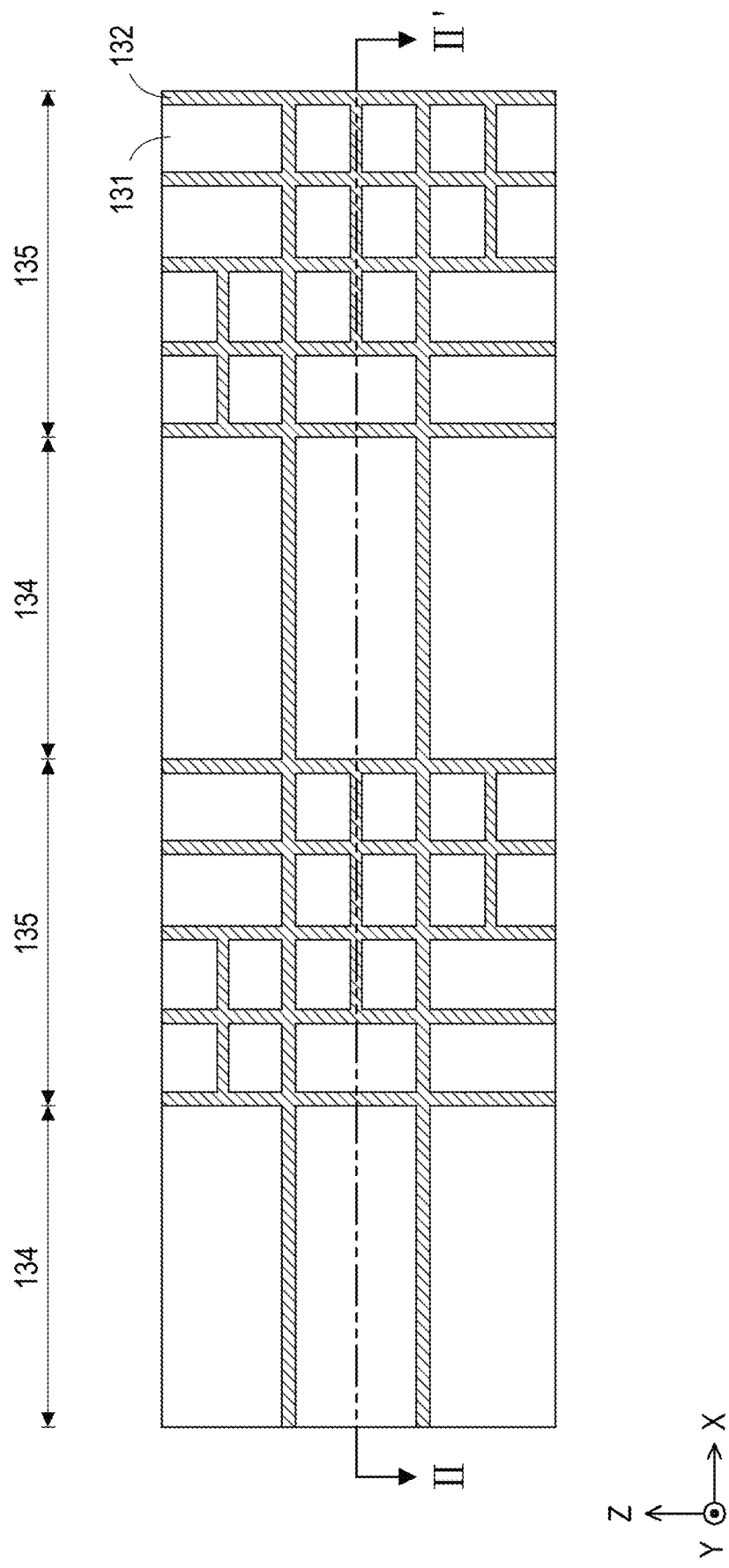
FIG. 2B is a schematic top view of a connecting member of FIG. 1B.
Figure 4:
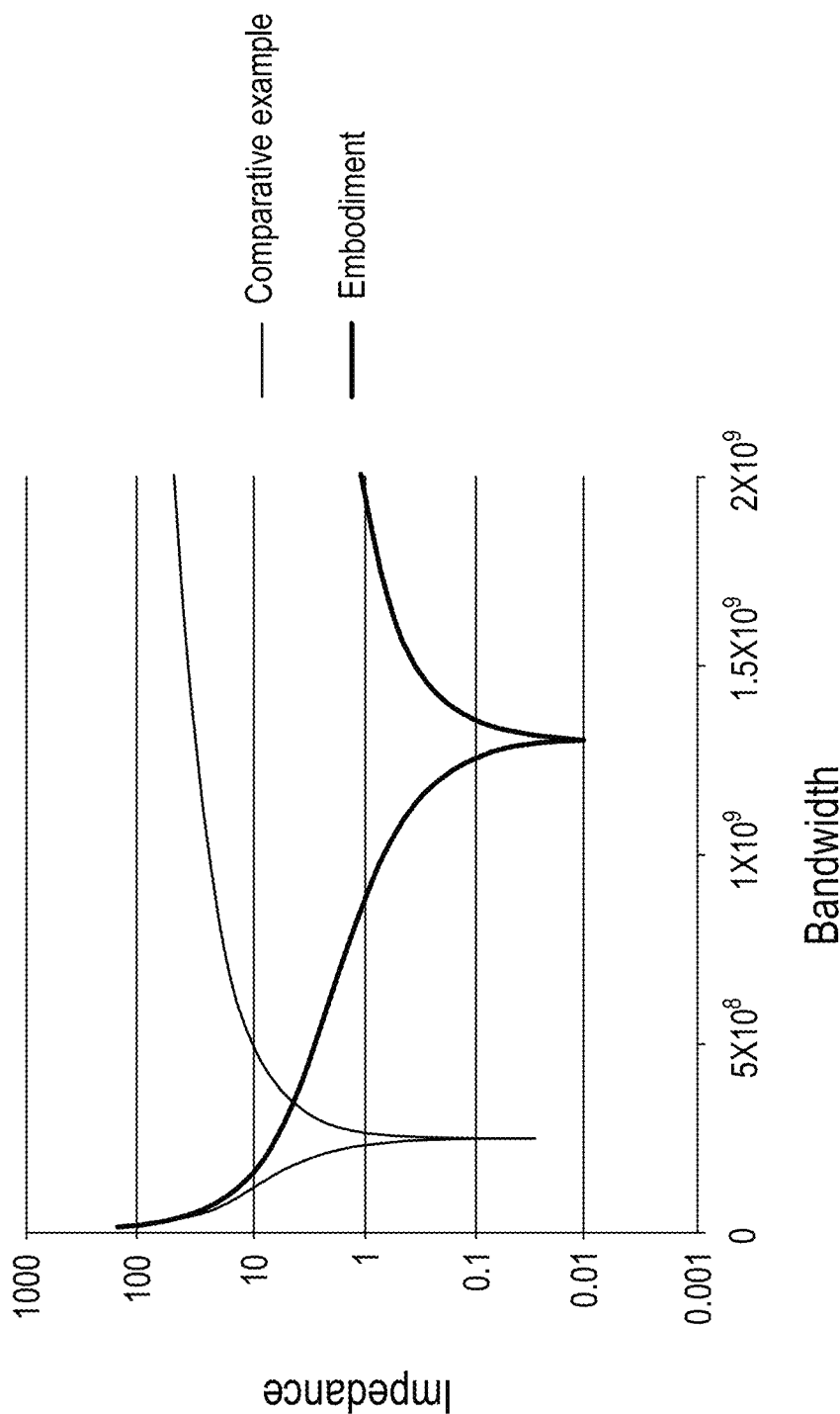
FIG. 4 is a schematic diagram showing an influence of a distance between two adjacent electronic components on impedance and bandwidth.

FIG. 1A to FIG. 1C are schematic partial cross-sectional views of a manufacturing method of an electronic component according to an embodiment of the disclosure. FIG. 2A is a schematic top view of a structure member of FIG. 1A. FIG. 2B is a schematic top view of a connecting member of FIG. 1B. FIG. 3 is a diagram showing a relationship between metal density and stress in a structure member/connecting member. FIG. 4 is a schematic diagram showing an influence of a distance between two adjacent electronic components on impedance and bandwidth. FIG. 1A is a schematic cross-sectional view of the structure member of FIG. 2A along a section line I-I'. FIG. 1B is a schematic cross-sectional view of the connecting member of FIG. 2A along a section line II-II', and FIG. 2A omits showing the structure member.

According to some embodiments, the manufacturing method of the electronic component 100 may include following steps:

First, referring to FIG. 1A and FIG. 2A, in first step Step I, a structure member 110 is formed on a carrier substrate S. To be specific, the structure member 110 includes a plurality of first insulating layers 111, a plurality of first metal layers 112 and a plurality of first conductive vias 113. Where, the first insulating layers 111 and the first metal layers 112 are alternately stacked into a multi-layer stack (for example, three layers of the first insulating layers 111 and three layers of the first metal layers 112, but the disclosure is not limited thereto) along a direction Y. The first conductive via 113 penetrates through the first insulating layer 111 to electrically connect one of the first metal layers 112 and another first metal layer 112. According to some embodiments, the first insulating layer 111 is fabricated by a high-temperature process, for example, by a chemical vapor deposition (CVD) method at a temperature of about 200° C.-300° C., but the disclosure is not limited thereto. The first metal layer 112 is made by, for example, sputtering, but the disclosure is not limited thereto. According to some embodiments, a material of the first metal layer 112 may include aurum (Au), argentums (Ag), aluminum (Al), copper (Cu), titanium (Ti), molybdenum (Mo), nickel (Ni), chromium (Cr), other suitable metal materials or alloys, or a combination of the above materials, but the disclosure is not limited thereto. According to some embodiments, a material of the first insulating layer 111 may include silicon nitride, silicon oxide, other suitable inorganic materials, or a combination of the above materials, but the disclosure is not limited thereto. According to some embodiments, a release film may be selectively provided between the carrier substrate S and the structure member 110, but the disclosure is not limited thereto. The carrier substrate S may include organic or inorganic materials, such as silicon wafer, quartz, glass, stainless steel, sapphire, epoxy resin, other suitable materials, or a combination of the above materials, but the disclosure is not limited thereto.

According to some embodiments, the first insulating layer 111 has a thickness T1 and the first metal layer 112 has a thickness T3. The thickness T1 is, for example, the maximum thickness of the first insulating layer 111 measured along a stacking direction (the direction Y) of the first insulating layers 111 and the first metal layers 112, but the disclosure is not limited thereto. The thickness T1 is, for example, greater than or equal to 0.1 micrometer ($\mu$m) or less than or equal to 5 $\mu$m, but the disclosure is not limited thereto. The thickness T3 is, for example, the maximum thickness of the first metal layer 112 measured along the stacking direction (the direction Y) of the first insulating layers 111 and the first metal layers 112, but the disclosure is not limited thereto. The thickness T3 is, for example, greater than or equal to 0.1 $\mu$m or less than or equal to 1 $\mu$m, but the disclosure is not limited thereto. In addition, according to some embodiments, a coefficient of thermal expansion (CTE) of the first insulating layer 111 is, for example, greater than or equal to 0.5 ppm/° C. or less than or equal to 5 ppm/° C., but the disclosure is not limited thereto.

According to some embodiments, the structure member 110 includes a surface 110a, a surface 110b, at least one working unit U, a first region 114 and a third region 115. The surface 110a and the surface 110b are opposite to each other. The at least one working unit U is disposed in the first region 114. At least two layers of the first metal layer 112 are overlapped in the direction Y to form the at least one working unit U, where the working unit U may include a passive element P, but the disclosure is not limited thereto. Namely, the structure member 110 includes at least one passive element P (for example, a capacitor, an inductor, or a resistor, but the disclosure is not limited thereto) disposed in the first region 114, so that the first region 114 includes a metal density D 1. The first region 114 and the third region 115 are adjacent to each other, and the third region 115 is adjacent to the first region 114. According to some embodiments, in the third region 115, an overlapped area of the two first metal layers 112 in the direction Y is less than 5% of the area of the first metal layer 112, but the disclosure is not limited thereto. The third region 115 includes a metal density D3, and the metal density D3 of the third region 115 is smaller than the metal density D1 of the first region 114, but the disclosure is not limited thereto. According to some embodiments, at least two layers of the first metal layer 112 are overlapped in the direction Y in the third region 115, but no conductive via 113 is connected to the first metal layers in the third region 115, but the disclosure is not limited thereto. According to some embodiments, a ratio of the metal density D1 of the first region 114 to the metal density D3 of the third region 115 may be, for example, greater than 1 and less than or equal to 9 (i.e., 1<D1/D3≤9), but the disclosure is not limited thereto. Materials of the conductive via 113 and the first metal layer 112 may be the same or different.

According to some embodiments, a direction X, the direction Y, and a direction Z are respectively different directions. The direction Y is, for example, the stacking direction of the first insulating layers 111 and the first metal layers 112, and the direction X is, for example, an extending direction of the section line I-I'. Where, the direction X is substantially perpendicular to the direction Y, and the direction X and the direction Y are respectively substantially perpendicular to the direction Z, but the disclosure is not limited thereto.

Referring to FIG. 1A, FIG. 1B, FIG. 2A, and FIG. 2B for a calculation method of metal density of the disclosure. For example, in the schematic top view of FIG. 2A, taking the three layers of the first insulating layers 111 and the three layers of the first metal layers 112 as an example, the first metal layers 112 may be divided into an upper layer, a middle layer, and a lower layer. The upper first metal layer 112 includes a first side 112a, a second side 112b, a third side 112c, and a fourth side 112d. The first side 112a and the second side 112b are opposite to each other, and the third side 112c and the fourth side 112d are opposite to each other, the third side 112c connects the first side 112a and the second side 112b, and the fourth side 112d connects the first side 112a and the second side 112b. A distance between the first side 112a and the second side 112b in the direction Z is DS1, and a distance between the third side 112c and the fourth side 112d in the direction X is DS2. Therefore, an area of the first metal layer 112 of each layer is DS1×DS2, a volume of the first metal layer 112 of each layer is DS1× DS2×T3, and a total volume of the three layers of the first metal layers 112 is DS1×DS2×T3×3. In addition, an extending line of the first side 112a of the upper first metal layer 112 in the direction X is L 1, an extending line of a second side 112b" of the lower first metal layer 112 in the direction X is L2, an extending line of a third side 112c' of the middle first metal layer 112 in the direction Z is L3, an extending line of the fourth side 112d of the upper first metal layer 112 in the direction Z is L4, and the extending line L1, the extending line L2, the extending line L3 and the extending line L4 may surround a maximum area. Where, a distance between the extending line L1 and the extending line L2 in the direction Z is DS3, and a distance between the extending line L3 and the extending line L4 in the direction X is DS4. Then, after a total volume of the three layers of the first insulating layers 111 under the maximum area (i.e., DS3× DS4×T1×3) is calculated, the total volume of the three layers of the first metal layers 112 (i.e., DS1×DS2×T3×3) is divided by the total volume of the three layers of the first insulating layers 111 (i.e., DS3×DS4×T1×3) to obtain a metal density of the three layers of the first metal layers 112 in the three layers of the first insulating layers 111 under the maximum area: (DS1×DS2×T3×3)/(DS3×DS4×T1×3).

Then, second step Step II is executed, referring to FIG. 1B and FIG. 2B, the connecting member 130 is formed on the surface 110b of the structure member 110. To be specific, the connecting member 130 includes a plurality of second insulating layers 131, a plurality of second metal layers 132 and a plurality of second conductive vias 133. The second insulating layers 131 and the second metal layers 132 are alternately stacked in order to form a multi-layer stack (for example, three layers of the second insulating layers 131 and four layers of the second metal layers 132, but the disclosure is not limited thereto). The second conductive via 133 penetrates through the second insulating layer 131 to electrically connect one of the second metal layers 132 and another second metal layer 132. A material of the conductive via 133 and the metal layer 132 may be the same as or different from the material of the conductive via 113 or the first metal layer 112. According to some embodiments, the second insulating layer 131 is manufactured by a low-temperature process, for example, by a coating method at a temperature of about 200° C.-350° C., but the disclosure is not limited thereto. The second metal layer 132 may include a seed layer and a thick metal layer. In some embodiments, a material of the second metal layer 132 may be copper, titanium, chromium, aluminum, gold, nickel, metal alloys of the above metals, other suitable metal materials, or a combination of the above materials. The second metal layer 132 may be made by, for example, sputtering, evaporation, electroplating, or other suitable methods, but the disclosure is not limited thereto. According to some embodiments, a material of the second insulating layer 131 may include photosensitive polyimide (PSPI), polyimide, other suitable organic materials, or a combination of the above materials, but the invention is not limited thereto.

According to some embodiments, the second insulating layer 131 has a thickness T2. The thickness T2 is, for example, the maximum thickness of the second insulating layer 131 measured along a stacking direction (the direction Y) of the second insulating layers 131 and the second metal layers 132. The thickness T2 is, for example, greater than or equal to 5 μm and less than or equal to 20 μm, but the disclosure is not limited thereto. The thickness T1 of the first insulating layer 111 is different from the thickness T2 of the second insulating layer 131. In addition, according to some embodiments, a coefficient of thermal expansion of the second insulating layer 131 is, for example, greater than or equal to 20 ppm/° C. or less than or equal to 40 ppm/° C., but the disclosure is not limited thereto. Where, the coefficient of thermal expansion of the first insulating layer 111 is smaller than the coefficient of thermal expansion of the second insulating layer 131.

According to some embodiments, the connecting member 130 includes a surface 130a, a surface 130b, a second region 134 and a fourth region 135. The surface 130a and the surface 130b are opposite to each other, and the surface 130a may contact the surface 110b of the structure member 110. The second region 134 and the fourth region 135 are adjacent to each other, and the second region 134 is adjacent to the fourth region 135. In the schematic cross-sectional view (as shown in FIG. 1B), the second region 134 may be overlapped with the first region 114 in the direction Y, and the fourth region 135 may be overlapped with the third region 115 in the direction Y. In addition, according to some embodiments, the second region 134 has a metal density D2, and the fourth region 135 has a metal density D4. The metal density D2 of the second region 134 may be less than the metal density D1 of the first region 114, and the metal density D4 of the fourth region 135 may be greater than the metal density D3 of the third region 115, but the disclosure is not limited thereto.

According to some embodiments, the structure member 110 may be disposed on a carrier substrate S. Since the coefficient of thermal expansion of the structure member 110 or the coefficient of thermal expansion of the first insulating layer 111 of the structure member 110 is smaller than the coefficient of thermal expansion of the carrier substrate S, the structure member 110 includes a compressive stress or a compressive stress thereof is less than zero. In the disclosure, the compressive stress being less than 0 means that a center of the structure member 110 may protrude out in the direction Y relative to the two sides of the structure member 110 (similar to a turtle shell shape), and cause a problem of warpage of the structure member 110. According to some embodiments, the connecting member 130 may be disposed on the carrier substrate S. Since the coefficient of thermal expansion of the connecting member 130 or the coefficient of thermal expansion of the insulating layer of the connecting member 130 is greater than the coefficient of thermal expansion of the carrier substrate S, the connecting member 130 includes a tensile stress or a tensile stress thereof is greater than zero. In the disclosure, the tensile stress being greater than 0 means that two sides of the connecting member 130 may protrude out in the direction Y relative to a center of the connecting member 130 (similar to a bowl shape), and also cause the problem of warpage of the connecting member 130. Where, since the direction of the compressive stress of the structure member 110 is opposite to the direction of the tensile stress of the connecting member 130, the embodiment may achieve stress balance by integrating the structure member 110 and the connecting member 130 together, so as to mitigate the warpage problem. According to some embodiments, the compressive stress of the structure member 110 and the tensile stress of the connecting member 130 may be affected by a tracing design of the metal layer. For example, the compressive stress or the tensile stress may be different due to the difference in metal density. Therefore, the metal density of the structure member 110 and the metal density of the connecting member 130 are required to be designed, so that after integration of the structure member 110 and the connecting member 130, the warpage problem of the electronic component may be further mitigated, but the disclosure is not limited thereto.

According to some embodiments, the first region 114 and the third region 115 in the structure member 110 include different metal densities, or the first region 114 and the third region 115 in the structure member 110 include different compressive stresses. The second region 134 and the fourth region 135 of the connecting member 130 include different metal densities, or the second region 134 and the fourth region 135 of the connecting member 130 include different tensile stresses. For example, the first region 114 of the structure member 110 includes a higher metal density, the second region 134 of the connecting member 130 includes a lower metal density, and the second region 134 is overlapped with the first region 114 in the direction Y. In addition, the third region 115 of the structure member 110 is disposed adjacent to the first region 114 and includes a lower metal density, and the fourth region 135 of the connecting member 130 is adjacent to the second region 134 and includes a higher metal density. The fourth region 135 is overlapped with the third region 115 in the direction Y. Through the above-mentioned metal density distribution and design in different regions, the structure member 110 and the connecting member 130 are integrated to achieve localized stress balance, which may mitigate an overall warpage problem of the integrated component, but the disclosure is not limited thereto.

For example, referring to FIG. 3, in the structure member 110, when the metal density increases, the compressive stress gradually decreases or the compressive stress approaches to zero. Namely, when the metal density of the structure member 110 increases, the difference between the coefficient of thermal expansion of the structure member 110 and the coefficient of thermal expansion of the carrier substrate S becomes smaller, which may further mitigate the warpage problem of the structure member 110 and the carrier substrate S. In the connecting member 130, when the metal density decreases, the tensile stress gradually decreases or the tensile stress approaches to zero. Namely, when the metal density of the connecting member 130 decreases, the difference between the coefficient of thermal expansion of the connecting member 130 and the coefficient of thermal expansion of the carrier substrate S becomes smaller, which may further mitigate the warpage problem of the connecting member 130 and the carrier substrate S. For example, when a total stress of the structure member 110 and the connecting member 130 after integration is greater than or equal to −20 and less than or equal to 20, a problem that the electronic component 100 affects subsequent processes due to warpage may be reduced, for example, the warpage affects the accuracy of exposure, etc. Through a design that a ratio of the metal density of the first region to the metal density of the third region of the structure member 110 is greater than 1 and less than or equal to 9, and the structure member 110 with high metal density is integrated with the connecting member 130 with low metal density, or the structure member 110 with low metal density is integrated with the connecting member 130 with higher metal density, for example, the structure member 110 with a metal density of 70% (stress −15) and the connecting member 130 with a metal density of 20% (stress 15) are integrated (overlapped in the direction Y), so that the total stress after integration is 0 or approaches to 0; or the structural layer 110 with a metal density of 20% (stress −50) and the connecting member 130 with a metal density of 60% (stress 55) are integrated, so that the total stress after integration is roughly 5. Through the above-mentioned design of metal density, for example, the total stress of the integrated structural layer 110 and the connecting member 130 may be ameliorated, thereby mitigating the overall warpage problem, or reducing the problems of metal circuit damage, component damage, or poor component reliability.

Then, referring to FIG. 1C, in step Step III, a chip 150 is disposed on one of the structure member 110 or the connecting member 130. For example, the chip 150 may be disposed on one of the surface 110*a* of the structure member 110 away from the connecting member 130 and the surface 130*b* of the connecting member 130 away from the structure member 110, and then the circuit board 170 may be disposed on the other one of the surface 110*a* of the structure member 110 away from the connecting member 130 and the surface 130*b* of the connecting member 130 away from the structure member 110, but the disclosure is not limited thereto. According to some embodiments, the structure member 110 or the connecting member 130 may be selectively removed from the carrier substrate S, but the disclosure is not limited thereto. According to some embodiments, the chip 150 includes pads 152, and the chip 150 may be bonded to the surface 110*a* of the structure member 110 through the pads 152 and solder balls 154. The circuit board 170 may be bonded to the surface 130*b* of the connecting member 130 through solder balls 156 and the second metal layer 132. According to some embodiments, the chip 150 or the circuit board 170 may be electrically connected to the structure member 110 or the connecting member 130 through a seed layer or a thick metal layer without configuring pads and solder balls, but the disclosure is not limited thereto. So far, the electronic component 100 of the embodiment has been manufactured. The chip 150 may include a low noise amplifier (LNA), a low-loss filter, a power amplifier, a baseband circuit, a power management integrated circuit (PMIC), a memory, a micro electro mechanical system (MEMS) device, an integrated circuit, other suitable active components, passive components, or combinations of the above devices, but the disclosure is not limited thereto.

In addition, it should be noted that in some embodiments, a distance between the chip 150 and the structure member 110 may be related to signal noise or signal quality of the electronic component 100. For example, referring to FIG. 4, in a comparative example, when the distance between the chip and the structure member is long, for example, when the chip is not overlapped with and is far from the structure member, a measured impedance is about 0.05 and a bandwidth is about $2.5 \times 10^8$. However, in an example, when the distance between the chip and the structure member is close, for example, when the chip is overlapped with and is adjacent to the structure member, the measured impedance is about 0.01 and the bandwidth is about $13 \times 10^8$. Therefore, in the schematic cross-sectional view of the embodiment (as shown in FIG. 1C), since the chip 150 may be overlapped with and adjacent to the structure member 110 in the direction Y, the distance between the chip 150 and the passive element P in the structure member 110 may be shortened, or the distance between the chip 150 and the passive element P disposed in the first region 114 may be shortened, thereby reducing the impedance and increasing the bandwidth, so as to achieve the effect of reducing signal noise or improving signal quality.

According to some embodiments, although the passive element P in the structure member 110 is, for example, a capacitor, the disclosure is not limited thereto. In some embodiments, the passive element P may also be a resistor, an inductor, a combination of the above elements, or other suitable passive elements. In addition, the connecting member 130 may be, for example, a redistribution layer, and the chip or other components may be electrically connected through the connecting member 130, but the disclosure is not limited thereto.

Figure 5A:
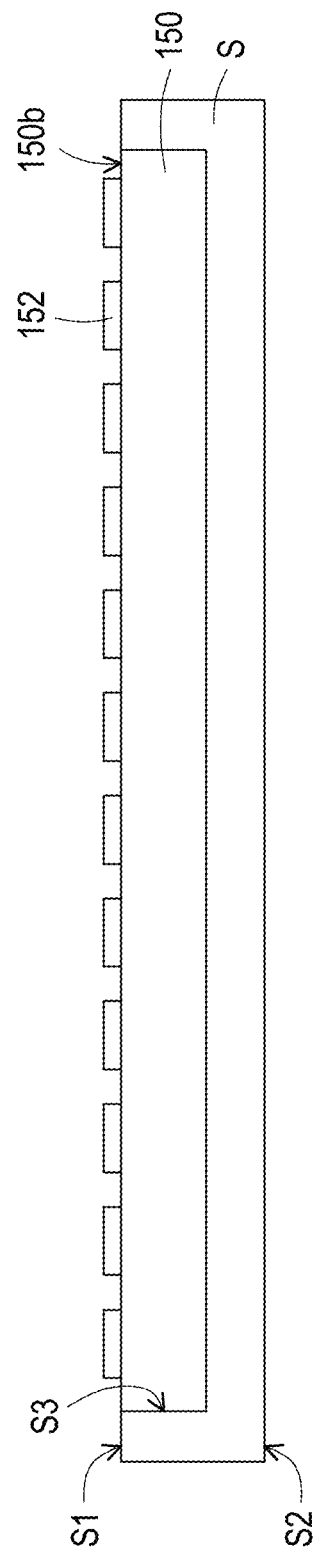
FIG. 5A to FIG. 5C are schematic partial cross-sectional views of a manufacturing method of an electronic component according to another embodiment of the disclosure.
Figure 5B:
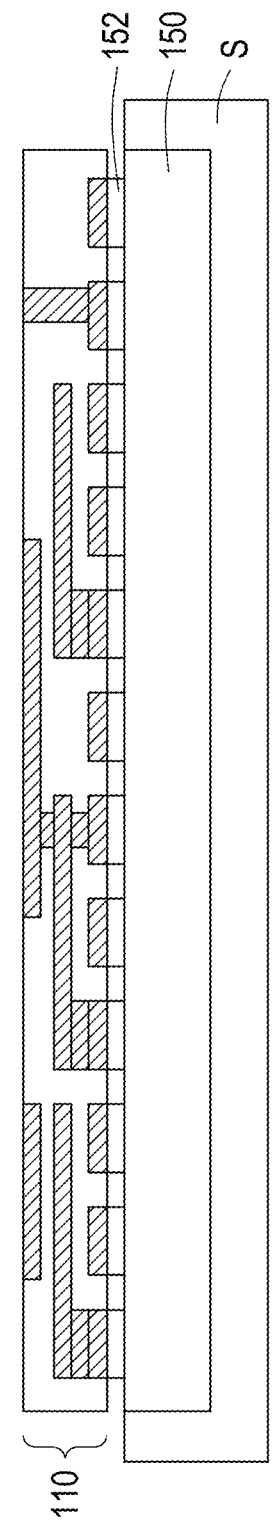
Figure 5C:
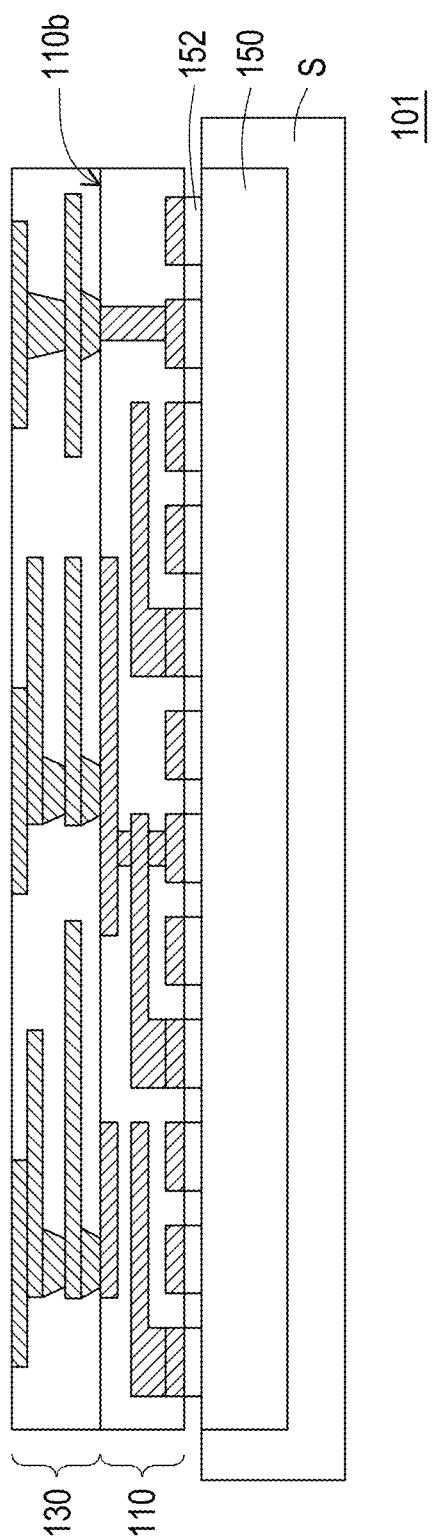

The manufacturing method of the electronic component of the disclosure may be applicable to, for example, a redistribution layer first (RDL first) manufacturing method (as shown in FIG. 1A to FIG. 1C), a chip first manufacturing method (as shown in FIG. 5A to FIG. 5C) or other manufacturing methods to reduce warpage of the electronic component or improve the reliability of the electronic component.

In brief, the electronic component 100 of the embodiment includes the structure member 110 and the connecting member 130. The structure member 110 includes at least one working unit U disposed in the first region 114. The connecting member 130 is disposed on the structure member 110 and includes the second region 134. In the schematic cross-sectional view, the second region 134 is overlapped with the first region 114, and the metal density of the second region 134 is less than the metal density of the first region 114.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

FIG. 5A to FIG. 5C are schematic partial cross-sectional views of a manufacturing method of an electronic component according to another embodiment of the disclosure. The embodiment shown in FIG. 5A to FIG. 5C is similar to the embodiment shown in FIG. 1A to FIG. 1C, so that the same elements are denoted by the same reference numerals, and detailed content thereof will not be repeated. A difference between the embodiment shown in FIG. 5A to FIG. 5C and the embodiment shown in FIG. 1A to FIG. 1C is that in the manufacturing method of an electronic component 101 of the embodiment, after the chip 150 is disposed on the carrier substrate S, the structure member 110 and the connecting member 130 are then formed in sequence.

First, referring to FIG. 5A, first step Step I is performed, where the chip 150 is placed on the carrier substrate S. To be specific, the carrier substrate S includes a first surface S1, a second surface S2 opposite to the first surface S1, and a groove S3 recessed into the first surface S1. The chip 150 is disposed in the groove S3, so that the surface 150*b* of the chip 150 away from the second surface S2 may be substantially aligned with the first surface S1. The chip 150 includes the pads 152.

Then, referring to FIG. 5B, second step Step II is performed, where the structure member 110 is disposed on the surface 150*b* of the chip 150 so that the structure member 110 may be electrically connected to the chip 150 through the pads 152.

Then, referring to FIG. 5C, third step Step III is performed, where the connecting member 130 is formed on the surface 110*b* of the structure member 110 so that the connecting member 130 may be electrically connected to the structure member 110. In this way, the electronic component 101 of the embodiment is manufactured.

Figure 6:
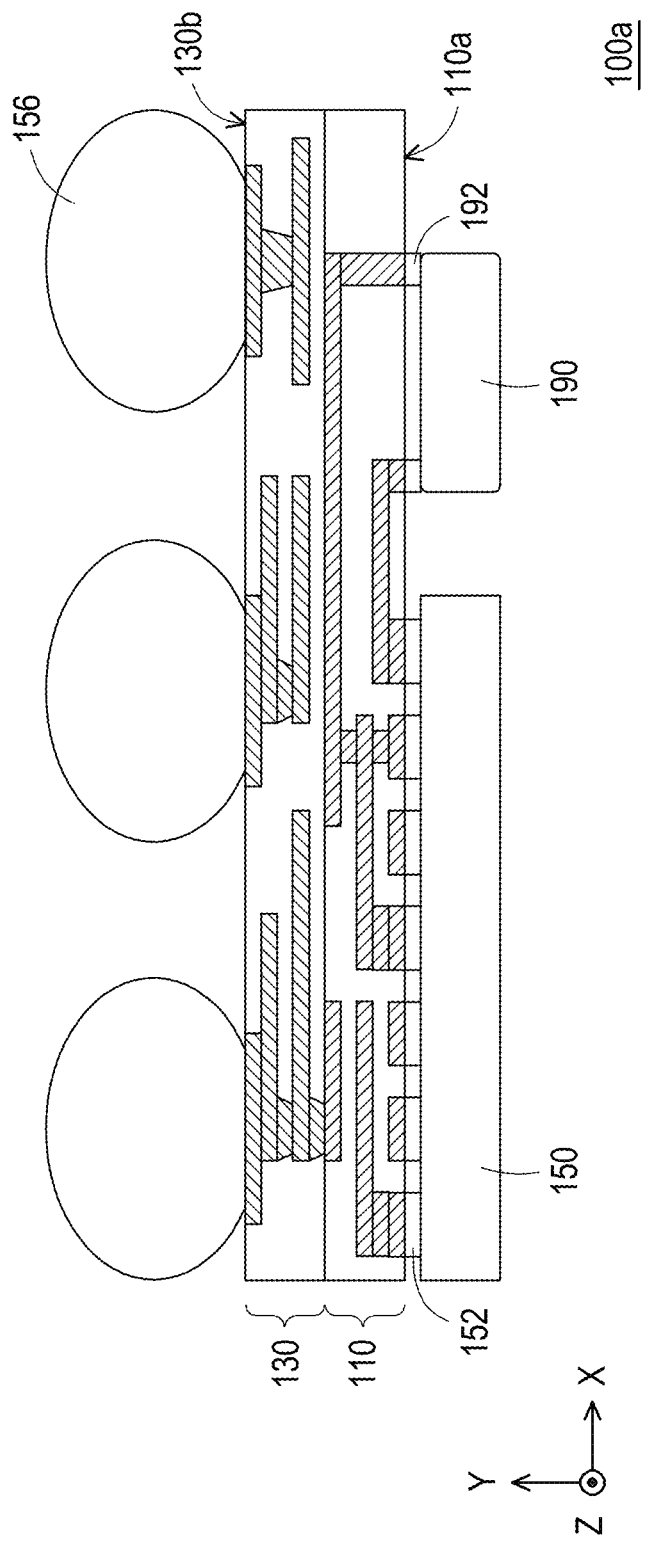
FIG. 6 is a schematic partial cross-sectional view of an electronic component according to another embodiment of the disclosure.

FIG. 6 is a schematic partial cross-sectional view of an electronic component according to another embodiment of the disclosure. Referring to FIG. 1C and FIG. 6 at the same time, an electronic component 100*a* of the embodiment is substantially similar to the electronic component 100 of FIG. 1C, so that the same and similar components in the two embodiments will not be repeated. A difference between the electronic component 100a of the embodiment and the electronic component 100 in that the electronic component 100a of the embodiment further includes a surface mount device (SMD) 190.

To be specific, referring to FIG. 6, in some embodiments, the chip 150 and the SMD 190 are respectively disposed on the surface 110a of the structure member 110 away from the connecting member 130, and a circuit board (not shown) may be disposed on the surface 130b of the connecting member 130 away from the structure member 110 through solder balls 156, but the disclosure is not limited thereto. According to some embodiments, the SMD 190 may be bonded and electrically connected to the structure member 110 through pads 192. The chip 150 may be bonded and electrically connected to the structure member 110 or the SMD 190 through the pads 152. The chip 150 is disposed adjacent to the SMD 190, so that the chip 150 is adjacent to the SMD 190, and there is no other chip or SMD between the adjacent chip 150 and SMD 190. In addition, the SMD 190 may be overlapped with the structure member 110 in the direction Y. The SMD 190 may be electrically connected to the chip 150 through the structure member 110, but the disclosure is not limited thereto. The configuration of the above-mentioned components may be adjusted according to actual requirements, which is not limited by the disclosure.

Figure 7:
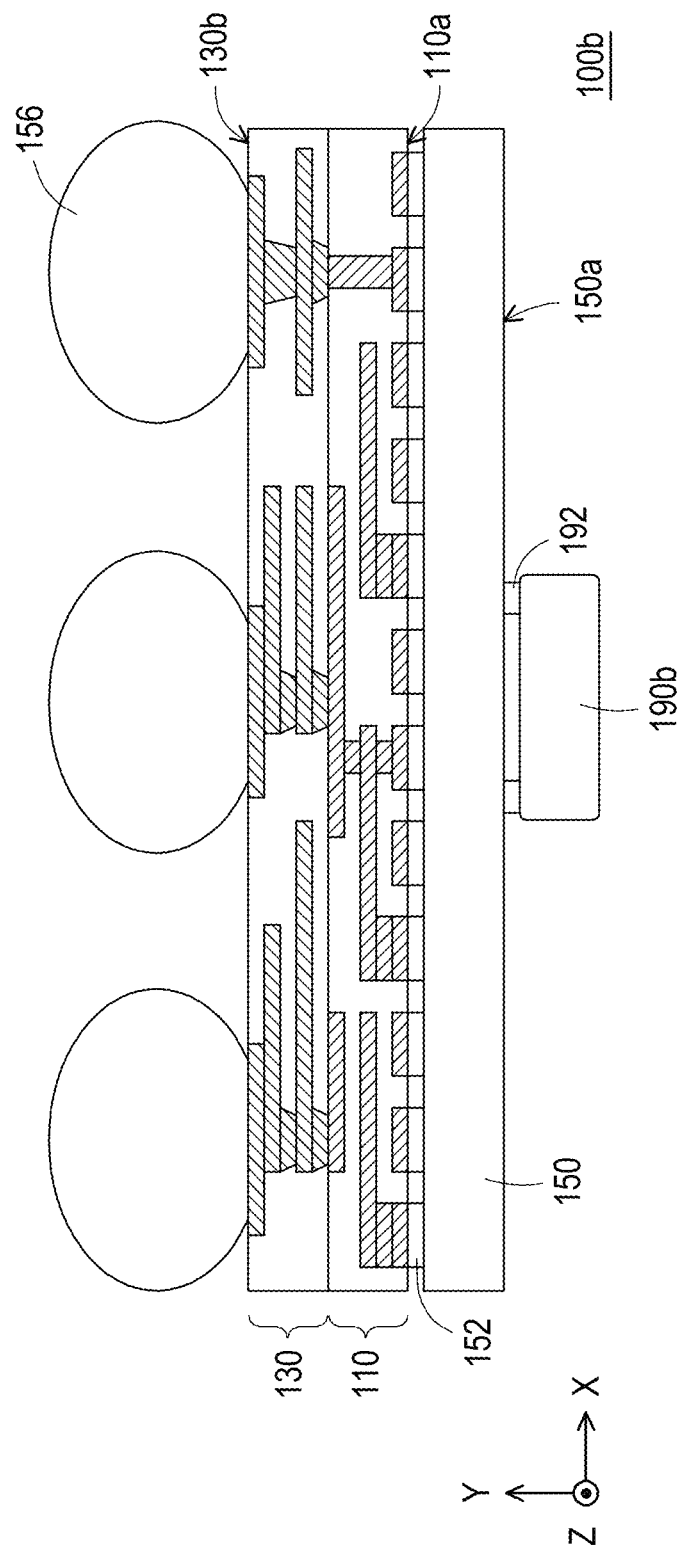
FIG. 7 is a schematic partial cross-sectional view of an electronic component according to another embodiment of the disclosure.

FIG. 7 is a schematic partial cross-sectional view of an electronic component according to another embodiment of the disclosure. Referring to FIG. 6 and FIG. 7 at the same time, an electronic component 100b of the embodiment is substantially similar to the electronic component 100a of FIG. 6, so that the same and similar components in the two embodiments will not be repeated. A difference between the electronic component 100b of the embodiment and the electronic component 100a is that in the electronic component 100b of the embodiment, the SMD 190b is disposed on the chip 150.

To be specific, referring to FIG. 7, in some embodiments, the SMD 190b is disposed on the surface 150a of the chip 150 away from the structure member 110. The SMD 190b may be bonded and electrically connected to the chip 150 through the pads 192. The structure member 110 and the SMD 190b are respectively located on two opposite sides of the chip 150.

Moreover, in the schematic cross-sectional view of the embodiment (as shown in FIG. 7), since the SMD 190b may be overlapped with and adjacent to the chip 150 in the direction Y, the distance between the SMD 190b and the chip 150 may be shortened, thereby reducing the impedance and increasing the bandwidth to achieve the effect of reducing signal noise or improving signal quality.

Figure 8:
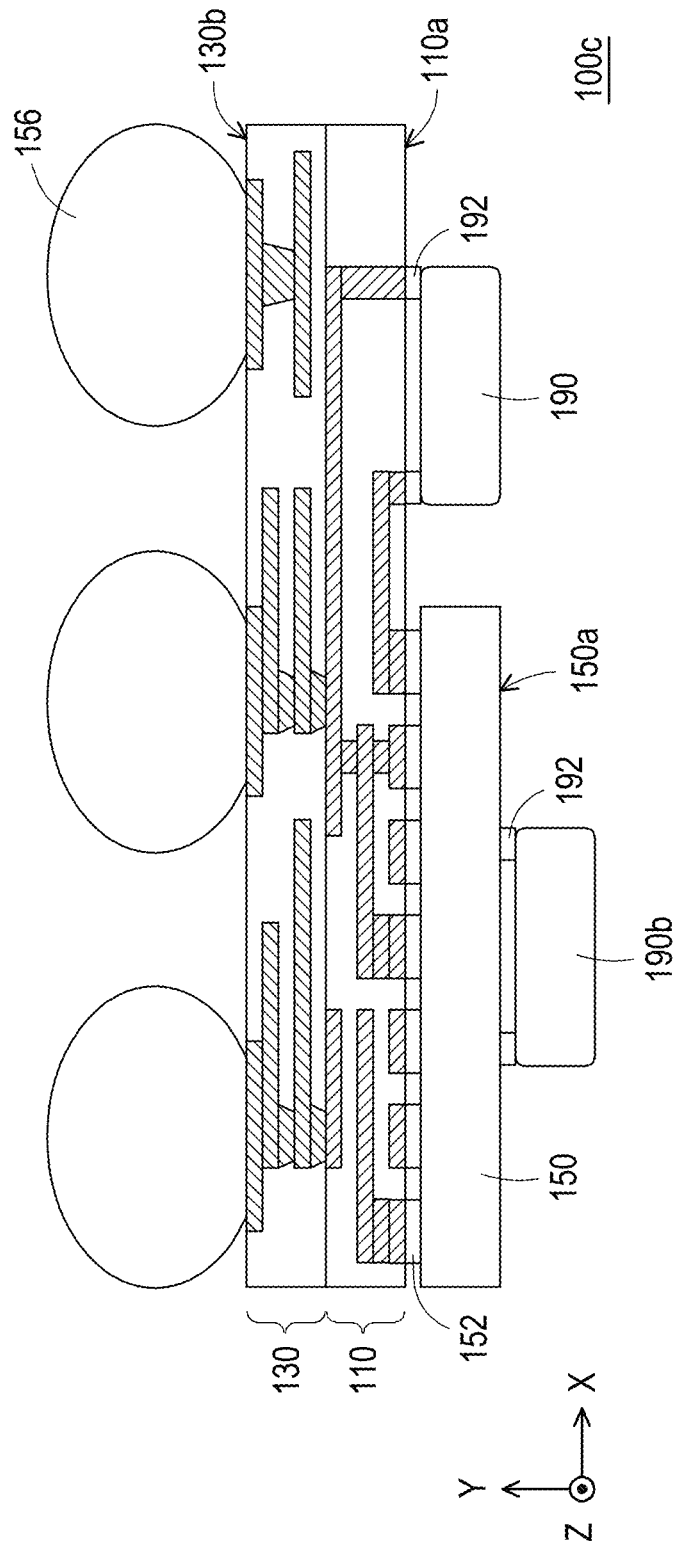
FIG. 8 is a schematic partial cross-sectional view of an electronic component according to another embodiment of the disclosure.

FIG. 8 is a schematic partial cross-sectional view of an electronic component according to another embodiment of the disclosure. Referring to FIG. 6 and FIG. 8 at the same time, an electronic component 100c of the embodiment is substantially similar to the electronic component 100a of FIG. 6, so that the same and similar components in the two embodiments will not be repeated. A difference between the electronic component 100c of the embodiment and the electronic component 100a is that the electronic component 100c of the embodiment further includes an SMD 190b.

To be specific, referring to FIG. 8, in some embodiments, the SMD 190b is disposed on the chip 150. The SMD 190b is disposed on the surface 150a of the chip 150 away from the structure member 110. The SMD 190 may be bonded and electrically connected to the chip 150 through the pads 192. The structure member 110 and the SMD 190b are respectively located on two opposite sides of the chip 150.

In addition, in the schematic cross-sectional view of the embodiment (as shown in FIG. 8), since the SMD 190b may be overlapped with and adjacent to the chip 150 in the direction Y, the distance between the SMD 190b and the chip 150 may be shortened, thereby reducing the impedance and increasing the bandwidth to achieve the effect of reducing signal noise or improving signal quality.

Figure 9:
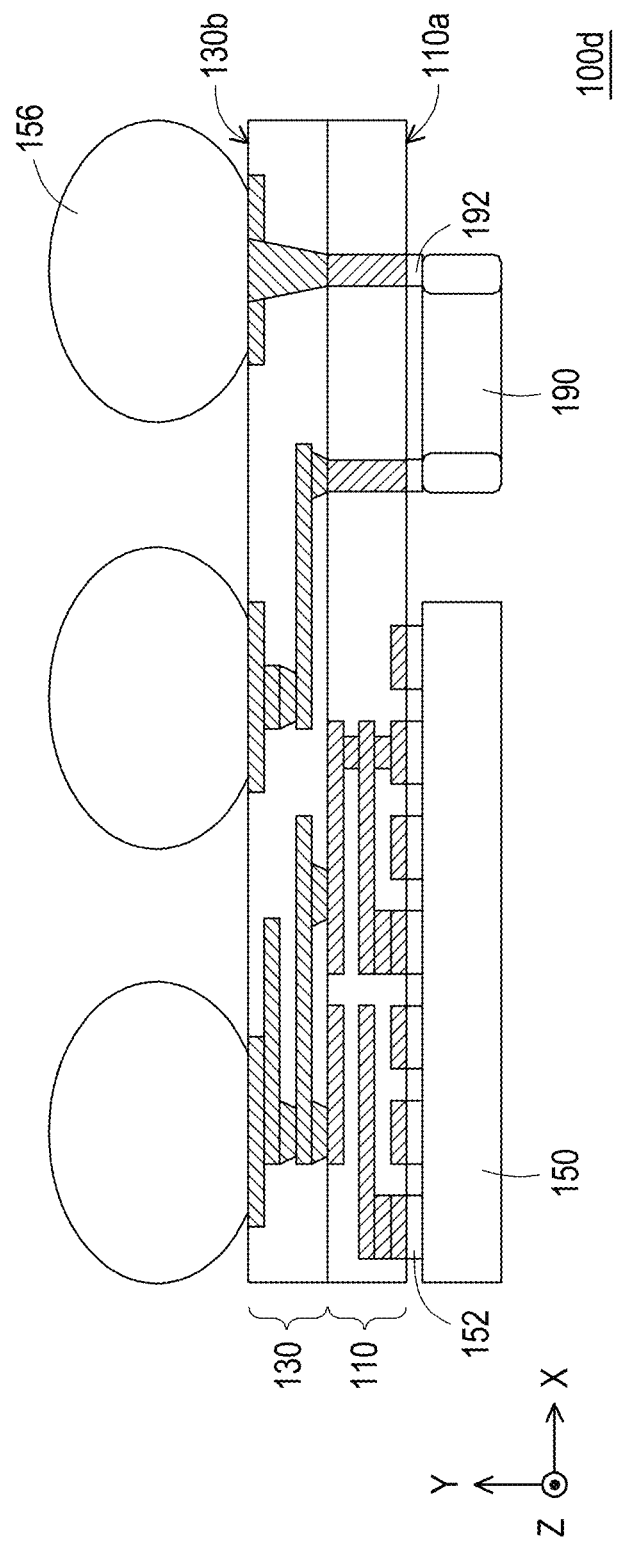
FIG. 9 is a schematic partial cross-sectional view of an electronic component according to another embodiment of the disclosure.

FIG. 9 is a schematic partial cross-sectional view of an electronic component according to another embodiment of the disclosure. Referring to FIG. 6 and FIG. 9 at the same time, an electronic component 100d of the embodiment is substantially similar to the electronic component 100a of FIG. 6, so that the same and similar components in the two embodiments will not be repeated. A difference between the electronic component 100d of the embodiment and the electronic component 100a is that in the electronic component 100d of the embodiment, the SMD 190 may be electrically connected to the connecting member 130 through the structure member 110, and the SMD 190 and the chip 150 are electrically separated.

In summary, in the electronic component of the disclosure, since the metal density D2 of the second region 134 overlapped with the first region 114 in the direction Y is less than the metal density D1 of the first region 114, and the metal density D4 of the fourth region 135 overlapped with the third region 115 in the direction Y is greater than the metal density D3 of the third region 115, the total stress of the structure member 110 and the connecting member 130 after integration may not cause a serious warpage problem, thereby mitigating the overall warpage problem. Moreover, according to some embodiments, since the chip may be overlapped with and adjacent to the structure member in the direction Y, the distance between the chip and the working unit in the structure member may be shortened, for example, the distance between the chip and the passive element in the structure member may be shortened, thereby reducing the impedance and increasing the bandwidth to achieve the effect of reducing signal noise or improving signal quality. In addition, since the SMD may also be overlapped with and adjacent to the chip in the direction Y, the distance between the SMD and the chip may be shortened, thereby reducing the impedance and increasing the bandwidth to achieve the effect of reducing signal noise or improving signal quality.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:
1. An electronic component, comprising:
a chip;
a structure member, electrically connected to the chip and comprising at least one working unit and a first insulating layer, wherein the at least one working unit is disposed in a first region;
a connecting member, disposed on the structure member, and comprising a metal layer, a second insulating layer surrounding the metal layer, and a second region, wherein the structure member is disposed between the chip and the connecting member; and
a solder ball overlapped with the metal layer, wherein the second region is overlapped with the first region, and a metal density of the second region is less than a metal density of the first region, wherein a coefficient of thermal expansion of the first insulating layer is smaller than a coefficient of thermal expansion of the second insulating layer.

2. The electronic component as claimed in claim 1, wherein the structure member further comprises a third region, wherein the third region is adjacent to the first region, and a metal density of the third region is less than the metal density of the first region.

3. The electronic component as claimed in claim 2, wherein a ratio of the metal density of the first region to the metal density of the third region is greater than 1 and less than or equal to 9.

4. The electronic component as claimed in claim 2, wherein the connecting member further comprises a fourth region, wherein the fourth region is overlapped with the third region, and a metal density of the fourth region is greater than the metal density of the third region.

5. The electronic component as claimed in claim 1, wherein a thickness of the first insulating layer is different from a thickness of the second insulating layer.

6. The electronic component as claimed in claim 5, wherein the thickness of the first insulating layer is greater than or equal to 0.1 µm or less than or equal to 5 µm, and the thickness of the second insulating layer is greater than or equal to 5 µm and less than or equal to 20 µm.

7. The electronic component as claimed in claim 1, wherein the coefficient of thermal expansion of the first insulating layer is greater than or equal to 0.5 ppm/° C. or less than or equal to 5 ppm/° ° C., and the coefficient of thermal expansion of the second insulating layer is greater than or equal to 20 ppm/° C. or less than or equal to 40 ppm/° C.

8. The electronic component as claimed in claim 1, wherein the chip is disposed on one of the structure member and the connecting member, and the chip is overlapped with the structure member.

9. The electronic component as claimed in claim 8, further comprising:
a surface mount device, disposed adjacent to the chip, and overlapped with the structure member.

10. The electronic component as claimed in claim 9, wherein the surface mount device is electrically connected to the chip through the structure member.

11. The electronic component as claimed in claim 9, wherein the surface mount device is electrically connected to the connecting member through the structure member, and the surface mount device is electrically separated from the chip.

12. The electronic component as claimed in claim 8, further comprising:
a surface mount device, disposed on a surface of the chip away from the structure member, and overlapped with the chip.

13. The electronic component as claimed in claim 1, wherein the structure member has a compressive stress, the connecting member has a tensile stress, and a direction of the compressive stress is opposite to a direction of the tensile stress.

14. The electronic component as claimed in claim 1, wherein the connecting member further comprises a fourth region, wherein the fourth region is adjacent to the second region, and a metal density of the fourth region is greater than the metal density of the second region.

15. The electronic component as claimed in claim 1, wherein the structure member comprises a plurality of first metal layers, and at least two of the plurality of first metal layers are overlapped in the first region.

16. A manufacturing method of an electronic component, comprising:
forming a structure member, wherein the structure member comprises at least one working unit and a first insulating layer, and the at least one working unit is disposed in a first region;
forming a connecting member on the structure member, wherein the connecting member comprises a metal layer, a second insulating layer surrounding the metal layer, and a second region;
disposing a chip, wherein the structure member is disposed between the chip and the connecting member, and the structure member is electrically connected to the chip; and
forming a solder ball, wherein the solder ball is overlapped with the metal layer,
wherein in a schematic cross-sectional view, the second region is overlapped with the first region, and a metal density of the second region is less than a metal density of the first region,
wherein a coefficient of thermal expansion of the first insulating layer is smaller than a coefficient of thermal expansion of the second insulating layer.

17. The manufacturing method of the electronic component as claimed in claim 16, wherein the structure member further comprises a third region, wherein the third region is adjacent to the first region, and a metal density of the third region is less than the metal density of the first region.

18. The manufacturing method of the electronic component as claimed in claim 17, wherein the connecting member further comprises a fourth region, wherein the fourth region is overlapped with the third region, and a metal density of the fourth region is greater than the metal density of the third region.

19. The manufacturing method of the electronic component as claimed in claim 16, wherein the chip is disposed on one of the structure member and the connecting member, and the chip is overlapped with the structure member.

* * * * *